(12) United States Patent
Lu et al.

(10) Patent No.: US 8,906,741 B2
(45) Date of Patent: Dec. 9, 2014

(54) ELECTRONIC PACKAGE STRUCTURE HAVING SIDE-WING PARTS OUTSIDE OF A PACKAGE LAYER FOR DISSIPATING HEAT AND METHOD FOR MAKING THE SAME

(75) Inventors: Bau-Ru Lu, Chang Hua County (TW); Kai-Peng Chiang, Tao Yuan (TW); Da-Jung Chen, Tao Yuan County (TW); Tsung-Chan Wu, Tai Nan County (TW)

(73) Assignee: Cyntec Co., Ltd., Hsin-Chu (TW)

( * ) Notice: Subject to any disclaimer, the term of this patent is extended or adjusted under 35 U.S.C. 154(b) by 477 days.

(21) Appl. No.: 13/175,362

(22) Filed: Jul. 1, 2011

(65) Prior Publication Data

US 2012/0044656 A1 Feb. 23, 2012

(30) Foreign Application Priority Data

Aug. 19, 2010 (TW) ............................... 099127794 A

(51) Int. Cl.
*H01L 21/00* (2006.01)
*H01L 23/31* (2006.01)
*H01L 23/64* (2006.01)
*H01L 23/495* (2006.01)
*H01L 23/00* (2006.01)

(52) U.S. Cl.
CPC ..... *H01L 23/495* (2013.01); *H01L 2224/32013* (2013.01); *H01L 24/45* (2013.01); *H01L 24/48* (2013.01); *H01L 2224/48091* (2013.01); *H01L 2224/73265* (2013.01); *H01L 2224/48247* (2013.01); *H01L 2224/92247* (2013.01); *H01L 2224/45144* (2013.01); *H01L 23/3121* (2013.01); *H01L 2224/32245* (2013.01); *H01L 23/645* (2013.01)
USPC ........... 438/106; 438/107; 438/124; 438/125; 438/126; 438/127; 257/676; 257/E21.499; 257/E23.114; 257/E23.031

(58) Field of Classification Search
CPC ........... H01L 2924/01079; H01L 2924/01078; H01L 2924/14; H01L 27/12
USPC ........... 257/676, E21.499, E23.114, E23.031; 438/104, 126, 102, 106, 107, 127, 381
See application file for complete search history.

(56) References Cited

U.S. PATENT DOCUMENTS

| | | | | |
|---|---|---|---|---|
| 4,517,738 | A * | 5/1985 | Fukuoka et al. | ............... 29/840 |
| 2001/0001070 | A1* | 5/2001 | Hsu et al. | ..................... 438/126 |
| 2008/0150095 | A1* | 6/2008 | Yang et al. | ................... 257/659 |
| 2008/0303125 | A1* | 12/2008 | Chen et al. | .................... 257/676 |
| 2010/0127361 | A1* | 5/2010 | Kuan et al. | .................... 257/666 |

* cited by examiner

*Primary Examiner* — Lex Malsawma
*Assistant Examiner* — Eric Jones
(74) *Attorney, Agent, or Firm* — Muncy, Geissler, Olds & Lowe, P.C.

(57) ABSTRACT

A method for making an electronic package structure is provided which comprises: providing a substrate; providing an inductor module; assembling the inductor module and the substrate so that they define a space; injecting package glue into the space defined by the inductor module and the substrate so as to form a package layer.

26 Claims, 12 Drawing Sheets

ELECTRONIC PACKAGE STRUCTURE HAVING SIDE-WING PARTS OUTSIDE OF A PACKAGE LAYER FOR DISSIPATING HEAT AND METHOD FOR MAKING THE SAME

BACKGROUND OF THE INVENTION (a) Field of the Invention

The invention relates to an electronic package structure and method for making the same, particularly to an electronic package structure capable of reducing the volume of the electronic package structure and method for making the same.

(b) Description of the Related Art

FIG. 1 shows a conventional direct current to direct current (DC to DC) converter package structure. As shown in FIG. 1, the structure disclosed by U.S. Pat. No. 6,212,086 is a DC-to-DC converter package. The DC-to-DC converter package structure 100 comprises a system circuit board 120, a copper substrate 110 and a plurality of electronic elements. The system circuit board 120 is placed on the copper substrate 110 and thus the heat can be uniformly dissipated through the copper substrate 110 provided on the bottom of the device. The above electronic elements comprise a main transformer 130, an output inductor 140, synchronous rectifiers 150, output capacitors 160 and input capacitors 170 which are provided on the system circuit board 120 and are electrically coupled to each other through the circuit layout inside the system circuit board 120. An independent output connector is provided on the right-hand side of the system circuit board 120 and is coupled to the system circuit board 120 through a flexible printed circuit board.

BRIEF SUMMARY OF THE INVENTION

One object of the invention is to provide an electronic package structure and method for making an electronic package structure, capable of reducing the volume of the electronic package structure. Another object of the invention is to provide an electronic package structure and method for making the same, which do not require utilizing any additional mold.

According to one embodiment of the invention, a method for making an electronic package structure is provided which comprises: providing a substrate; providing an inductor module; assembling the inductor module and the substrate so that the inductor module and the substrate define a space; and injecting package glue into the space defined by the inductor module and the substrate so as to form a package layer. In one embodiment, the above mentioned method further comprises assembling a chip module on the substrate so that the chip module is electrically coupled to a circuit of the substrate. The step of forming a package layer comprises having the package glue coated on the chip module.

In one embodiment, the step of providing a substrate comprises: forming a main body part of the substrate; and forming at least one first connection part on at least one side of the main body part. The step of providing an inductor module comprises: forming an inductor element of the inductor module; and forming at least one side-wing part on at least one side of the inductor element and having the at least one side-wing part protrude from one surface of the inductor element. The step of assembling the inductor module and the substrate comprises: assembling the at least one first connection part with the at least one side-wing part to provide the inductor module on the substrate so that the inductor element of the inductor module, the at least one side-wing part and the main body part of the substrate together define the space.

In one embodiment, the step of providing a substrate comprises: forming a main body part of the substrate; and forming at least one side-wing part on at least one side of the main body part and having the at least one side-wing part protrude from one surface of the main body part. The step of providing an inductor module comprises: forming an inductor element of the inductor module; and forming at least one first connection part on at least one side of the inductor element. The step of assembling the inductor module and the substrate comprises: assembling the at least first connection part with the at least one side-wing part to provide the inductor module on the substrate so that the inductor element of the inductor module, the main body part of the substrate and the at least one side-wing part together define the space.

According to one embodiment of the invention, an electronic package structure comprising a substrate, an inductor module and a package layer is provided. The substrate comprises a circuit for having the electronic package structure in operation. The inductor module operates in coordination with the substrate so as to have the electronic package structure in operation and defines a space together with the substrate. The package layer is positioned in the space. The package layer is formed by injecting package glue into the space defined by the inductor module and the substrate. In one embodiment, the electronic package structure further comprises a chip module provided on the substrate and electrically coupled to a circuit of the substrate. The package layer covers the chip module. In one embodiment, the substrate and the inductor module are in contact with the package layer separately and, in the contact area of the package layer with the substrate and the inductor module, the package layer is substantially filled with a rough structure located in the contact area of the substrate and the inductor module.

In one embodiment, the substrate comprises a main body part and at least one first connection part. The chip module is provided on the main body part. The at least one first connection part is provided on at least one side of the main body part. The inductor module comprises an inductor element and at least one side-wing part. The at least one side-wing part is provided on at least one side of the inductor element and protrudes from one surface of the inductor element. The at least one side-wing part extends from the inductor element toward the substrate so that the at least one side-wing part is assembled with the first connection part.

In one embodiment, the substrate comprises a main body part and at least one side-wing part. The chip module is provided on the main body part. The at least one side-wing part is provided on at least one side of the main body part and protrudes from one surface of the inductor element. The inductor module comprises an inductor element and at least one first connection part. The at least one first connection part is provided on at least one side of the inductor element. The at least one side-wing part extends from the main body part toward the inductor module so that the at least one side-wing part is assembled with the first connection part.

In one embodiment, the electronic package structure is adapted to be provided on a circuit board and the chip module or the inductor module is electrically coupled to the substrate through the circuit board.

According to one embodiment of the invention, an electronic package structure comprising an inductor module and a package layer is provided. The inductor module comprises an inductor element, a first side-wing part, a second side-wing part and a package layer. The first side-wing part is provided on one side of the inductor element and protrudes from one surface of the inductor element. The second side-wing part is provided on the other side of the inductor element and protrudes from the surface of the inductor element so that the surface, the first side-wing part and the second side-wing part form a space. The package layer is in the space. The width of the package layer is equal to or substantially equal to the distance between the first side-wing part and the second side-wing part.

In one embodiment, the electronic package structure further comprises a substrate. The substrate comprises a circuit for having the electronic package structure in operation. The inductor module operates in coordination with the substrate so as to have the electronic package structure in operation and the surface of the inductor module, the first side-wing part and the second side-wing part define a space together with the substrate. In one embodiment, the package layer is formed by injecting package glue into the space.

In one embodiment, the substrate is electrically coupled to the inductor module and the package layer is used to isolate the inductor module from the chip module and conducting wires on the substrate, by which a stack structure is formed. Compared to the prior art in which the elements are directly connected to the plane of a substrate, the embodiment of the invention can effectively utilize space and reduce the volume of the electronic package structure. In one embodiment, the space between the inductor module and the substrate is used as a mold cavity to form a package layer without requiring any additional mold. Accordingly, the production cost is decreased and the design change can be more easily carried out. Furthermore, in another embodiment, the inductor module can be used to cover the chips to inhibit electromagnetic interference (EMI).

Other objects and advantages of the invention can be better understood from the technical characteristics disclosed by the invention. In order to clarify the above mentioned and other objects and advantages of the invention, examples accompanying with figures are provided and described in details in the following.

DETAILED DESCRIPTION OF THE INVENTION

FIGS. 2A~2F show cross-sectional schematic diagrams illustrating the electronic package structures in each step of the method of making an electronic package structure according to one embodiment of the invention. As shown in FIGS. 2A~2F, according to one embodiment of the invention, the method for making an electronic package structure comprises the following steps.

Figure 2A:
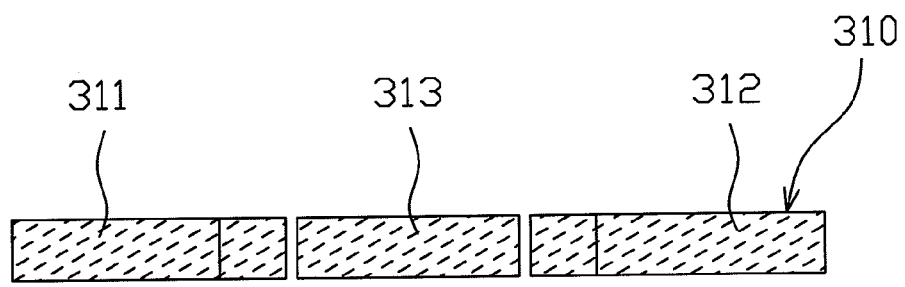
FIGS. 2A~2F show cross-sectional schematic diagrams illustrating the electronic package structures in each step of the method of making an electronic package structure according to one embodiment of the invention.

As shown in FIG. 2A, step S02: providing a substrate 310. In one embodiment, step S02 comprises: forming a main body part 313 of the substrate 310; and forming at least one side-wing part of the substrate 310 on at least one side of the main body part 313 and having the at least one side-wing part to be protruded from one surface of the main body part 313. Specifically, the substrate 310 comprises a main body part 313 and a first side-wing part 311 and a second side-wing part 312 provided on the two sides of the main body part 313. In this specification, the substrate is a carrier plate for an electronic package structure functioning in a system. The substrate may further has a circuit for the electronic package structure being in operation. The phrase "an element electrically coupled to the substrate" indicates that the element is directly or indirectly electrically coupled to the circuit of the substrate so that the electronic package structure can operate in a system. Since substrate manufacturing and circuit design on the substrate can be accomplished by one skilled in the art, their detail descriptions will be omitted in this specification. The present invention does not specifically limit the material of the substrate and different substrates can be used for different products. The material of the substrate can be a lead-frame, printed circuit board (PCB), or ceramic or the combination of the above. As the substrate is a lead-frame, the substrate itself is a conductor and can be used to form a circuit. As the substrate is a printed circuit board or ceramic, the substrate can be provided with a circuit layout. In the embodiment shown in FIG. 2A, the substrate 310 is a lead-frame.

Figure 2B:
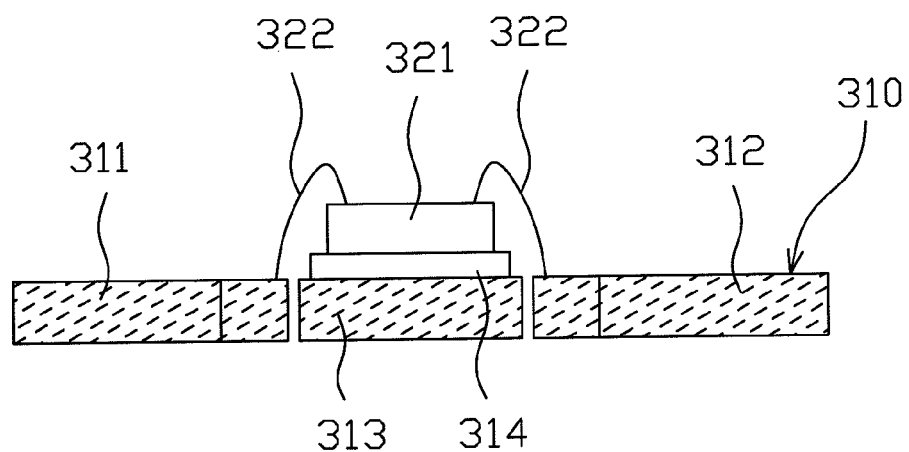

As shown in FIG. 2B, step S04: assembling a chip module 321 with the main body part 313 of the substrate 310, wherein the chip module 321 is electrically coupled to the substrate 310. In one embodiment, the chip module 321 and the main body part 313 of the substrate 310 are bonded together by an adhesive layer 314. In one embodiment, step S04 can further comprise having at least one conducting wire 322 be electrically coupled between the chip module 321 and the substrate 310 by wire bonding.

Figure 2C:
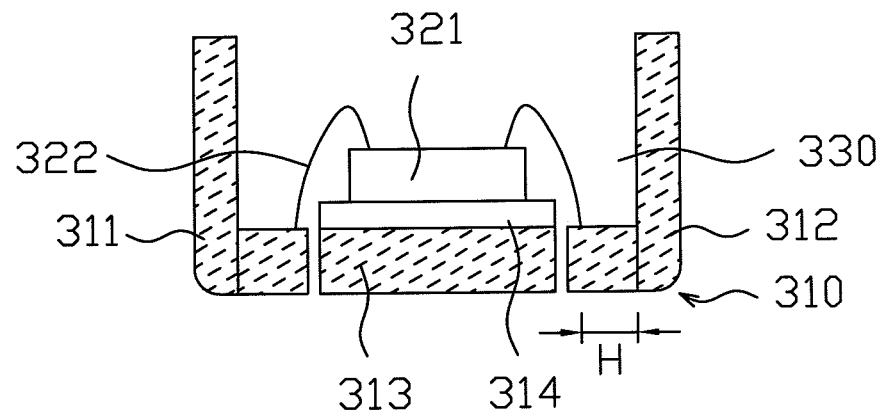

As shown in FIG. 2C, step S06: bending the first side-wing part 311 and the second side-wing part 312 so that the first side-wing part 311 and the second side-wing part 312 separately extend in a direction away from one surface of the main body part 313 and the chip module 321 is positioned between the first side-wing part 311 and the second side-wing part 312.

Figure 2D:
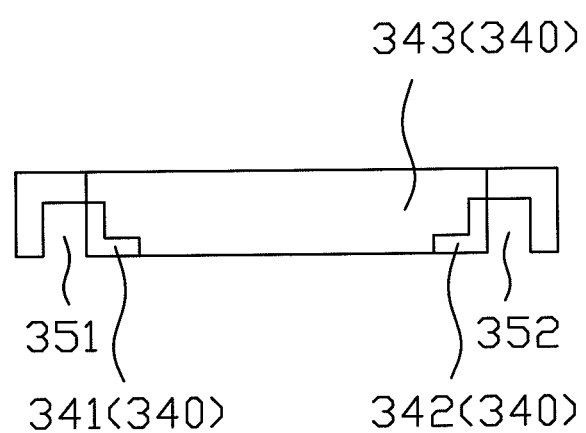

As shown in FIG. 2D, step S08: providing an inductor module 340. The inductor module 340 can be a choke module which defines a first groove 351 and a second groove 352 and comprises a choke 343 and a first lead 341 and a second lead 342 provided on the two sides of the choke 343. Preferably, the positions of the first groove 351 and the second groove 352 correspond to those of the first side-wing part 311 and the second side-wing part 312, respectively. Besides, the inductor module 340 can further comprise other electronic elements to operate in coordination with the substrate for having the electronic package structure in operation. The choke 343 can be electrically coupled to the first lead 341 and the second lead 342 through these electronic elements. The design of the inductor module 340 can be accomplished by one skilled in the art and thus their detail descriptions will omitted hereafter.

Figure 2E:
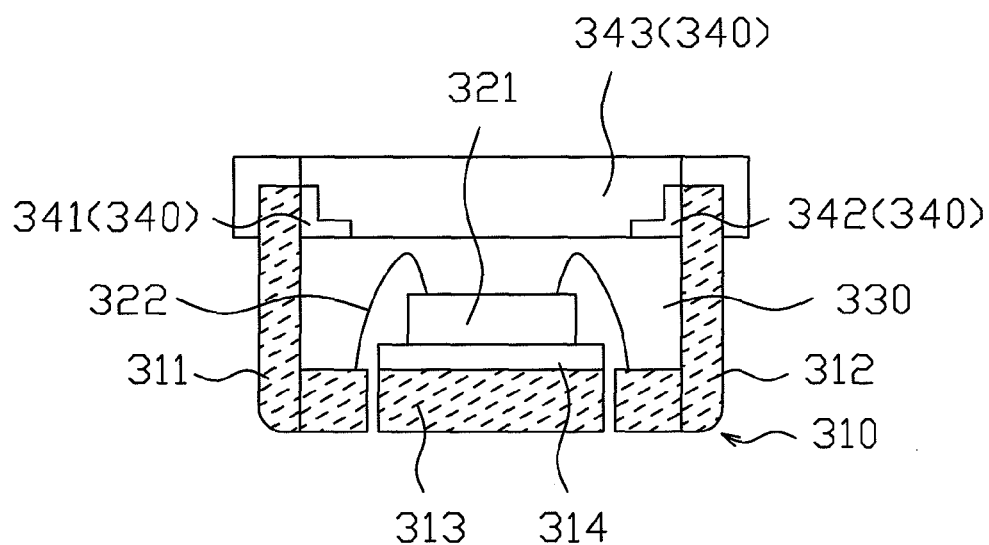

As shown in FIG. 2E, step S10: assembling the inductor module 340 and the substrate 310 so that the inductor module 340 and the substrate 310 define a space (or called "mold cavity"). In this embodiment, the first side-wing part 311 and the second side-wing part 312 are separately assembled to the first groove 351 and the second groove 352. In one embodiment, the shape and the size of the first side-wing part 311 are fitted with those of the first groove 351 so that the inductor module 340 can be positioned on the substrate 310. In one embodiment, the shape and the size of the second side-wing part 312 are fitted with those of the second groove 352. It should be understood that the way of assembling the inductor module 340 and the substrate 310 is not limited to the above embodiment. In one embodiment, the first side-wing part 311 and the second side-wing part 312 can be separately connection structures and the first groove 351 and the second groove 352 can be separately other connection structures. The connection structure and the other connection structure are fitted to each other to assemble the inductor module 340 and the substrate 310. These connection structures and other connection structures can be accomplished by one skilled in the art and thus their detail descriptions will be omitted hereafter.

As shown in FIG. 2E, step S12: injecting package glue into the mold cavity defined by the inductor module 340 and the substrate 310 and performing baking so as to form a package layer 330 which packages the chip module 321 and the conducting wire 322. Finally, dicing or the like is performed to form a single electronic package structure 300.

Figure 2F:
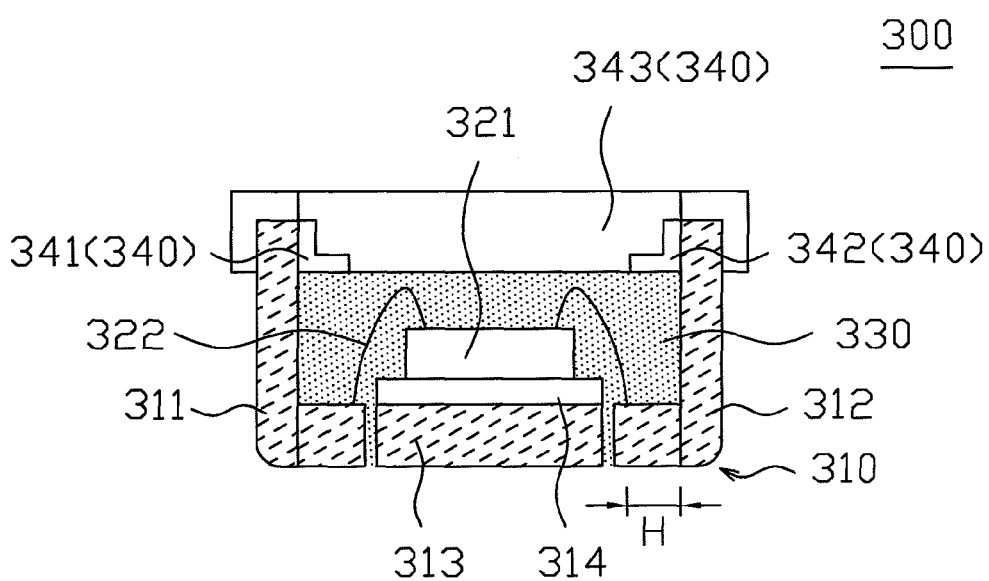

As shown in FIG. 2F, according to one embodiment of the invention, the electronic package structure 300 comprises a substrate 310, a chip module 321, at least one conducting wire 322, a package layer 330 and an inductor module 340. The substrate 310 comprises a main body part 313 and a first side-wing part 311 and a second side-wing part 312 provided on the two sides of the main body part 313. The chip module 321 is provided on the main body part 313 of the substrate 310 and the conducting wires 322 are connected between the chip module 321 and the substrate 310. The package layer 330 is provided on the main body part 313 of the substrate 310 and covers the chip module 321 and the conducting wires 322. The package layer 330 is provided in the space defined by the inductor module 340 and the substrate 310. The package layer 330 is formed by injecting the thermally melt package glue into the space defined by the inductor module 340 and the substrate 310 and then cooling. The inductor module 340 defines a first groove 351 and a second groove 352 and comprises a first lead 341 and a second lead 342 provided on the two sides of the choke 343. The first side-wing part 311 and the second side-wing part 312 of the substrate 310 extend toward the inductor module 340 until they reach the first lead 341 and the second lead 342 of the inductor module 340 and are electrically coupled to the first lead 341 and the second lead 342, separately.

In one embodiment, the main body part 313 of the substrate 310 can be a printed circuit board or ceramic while the first side-wing part 311 and the second side-wing part 312 can be lead frames provided on the two sides of the main body part 313. According to this design, the problem can be solved that a printed circuit board or ceramic used as the substrate cannot be bent. In one embodiment of the invention, the electronic package structure 300 may be a DC-to-DC converter package structure.

According to this embodiment, compared with the prior art, this embodiment has at least one of the following merits.

Figure 1:
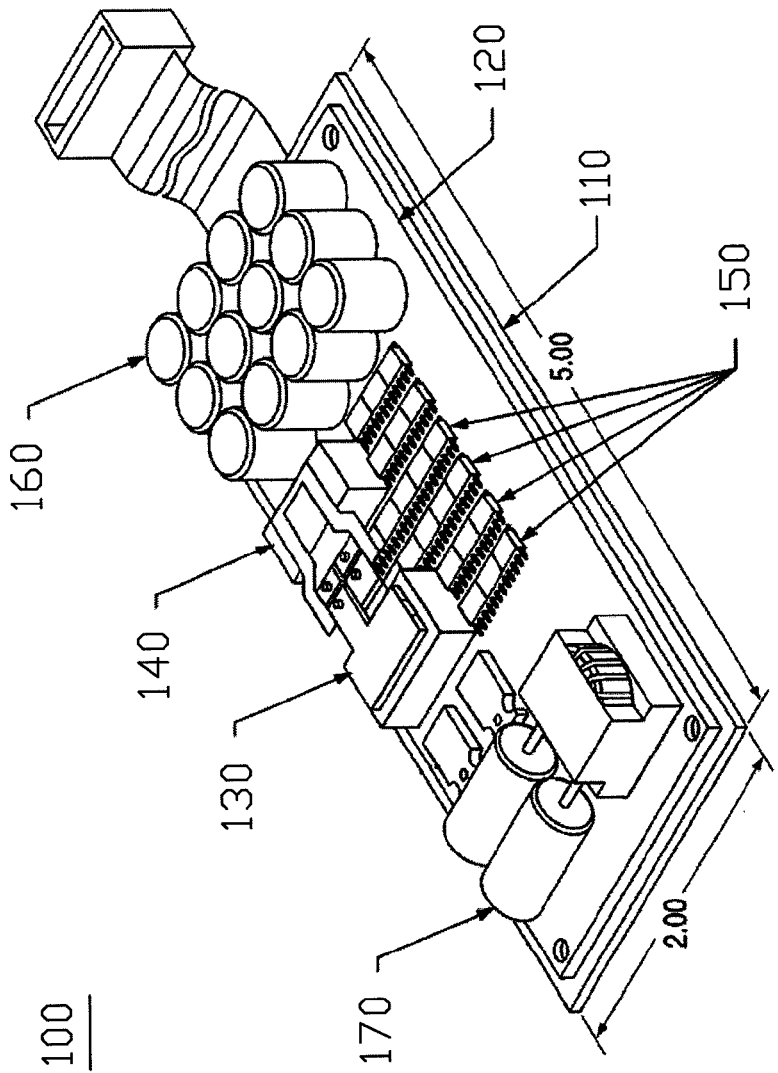
FIG. 1 shows a schematic diagram illustrating a conventional DC-to-DC converter package structure.

In this embodiment, the first side-wing part 311 and the second side-wing part 312 of the substrate 310 are electrically coupled to the first lead 341 and the second lead 342 of the inductor module 340 to form a stack structure. Compared to the prior art shown in FIG. 1 where the electronic elements are directly connected to the plane of the substrate in general, this embodiment can effectively utilize space and reduce the volume of the electronic package structure 300.

FIGS. 3A~3F show cross-sectional schematic diagrams illustrating the electronic package structures in each step of the method of making an electronic package structure according to one embodiment of the invention. As shown in FIGS. 3A~3D, according to one embodiment of the invention, the method for making an electronic package structure comprises the following steps.

Figure 3A:
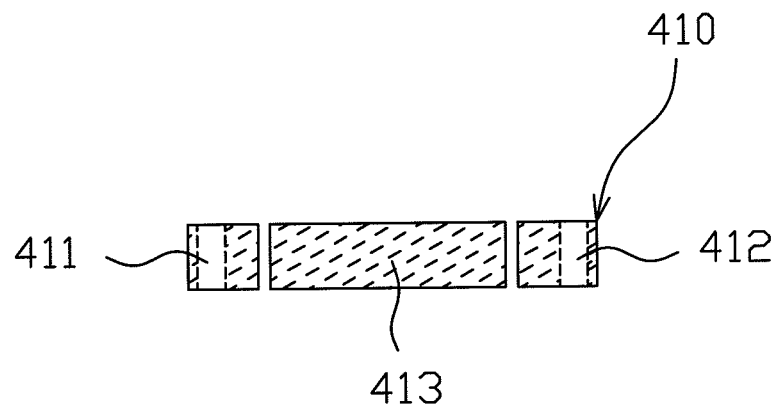
FIGS. 3A~3E show cross-sectional schematic diagrams illustrating the electronic package structures in a step of the method of making an electronic package structure according to one embodiment of the invention.
Figure 4A:
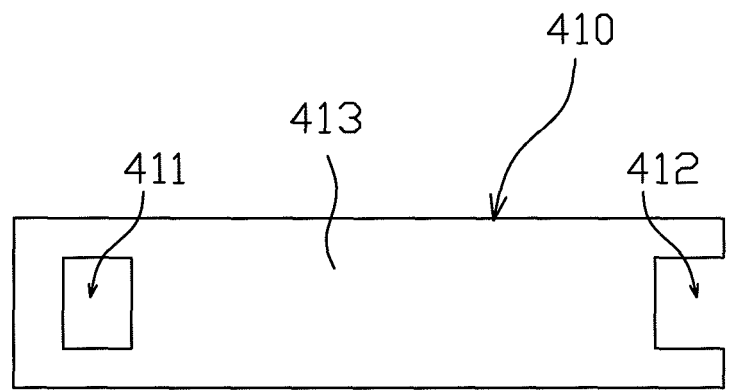
FIG. 4A shows a top-view schematic diagram illustrating one embodiment of the invention.

As shown in FIG. 3A, step S22: providing a substrate 410. In one embodiment, step S22 comprises: forming a main body part 413 of the substrate 410; and forming at least one connection part of the substrate 410 on at least one side of the main body part 413. Therefore, the substrate 410 comprises a main body part 413 and a first connection part 411 and a second connection part 412 provided on the two sides of the main body part 413. In one embodiment, the substrate 410 can comprise a circuit for having the electronic package structure in operation. The present invention does not specifically limit the material of the substrate and different substrates can be used for different products. The material of the substrate can be a lead-frame, printed circuit board (PCB), or ceramic, etc. FIG. 4A shows a top-view schematic diagram illustrating the substrate of this embodiment of the invention. As shown in FIG. 4A, in one embodiment, the first connection part 411 and the second connection part 412 may be openings or notches defined by the substrate 410 and their shapes are not limited. Besides, in another embodiment, they can be bumps (not shown). Specifically, in one embodiment, the substrate is a lead frame, and the step S22 comprises the following steps: S202 and S204. Step S202: performing semi-etching on the lead-frame and step S204: plating silver on one surface of the lead-frame.

Figure 3B:
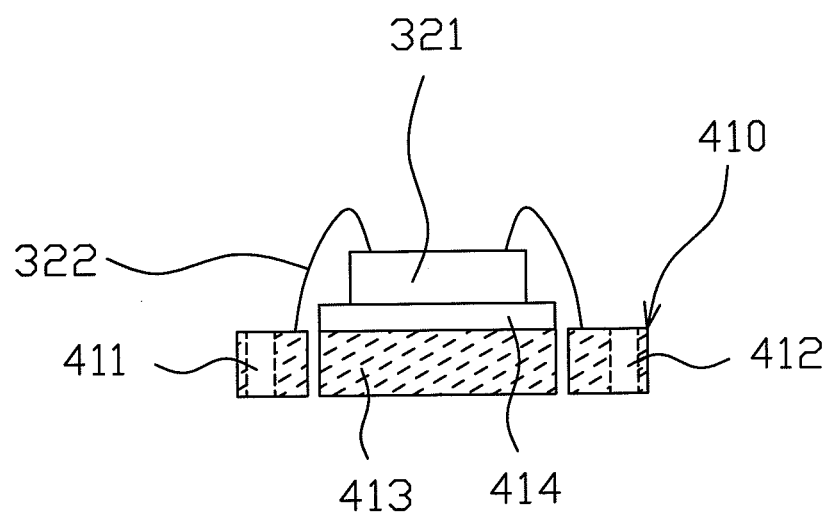

As shown in FIG. 3B, step S24: assembling a chip module 321 with the main body part 413 of the substrate 410, wherein the chip module 321 is electrically coupled to the substrate 410. In one embodiment, step S24 can further comprise having at least one conducting wire 322 be electrically coupled between the chip module 321 and the substrate 410 by wire bonding. Specifically, the step S24 comprises the following steps in one embodiment. Step S402: glue dispensing, that is, coating an adhesive layer 414 on the substrate 410 where the adhesive layer 414 can be conductive glue or non-conductive glue. Step S404: die bonding, that is, placing the chip module 321 on the adhesive layer 414. Step S406: wire bonding (such as Au wire bond), that is, having the conducting wires 322 be coupled to the chip module 321 and the lead-frame.

Figure 3C:
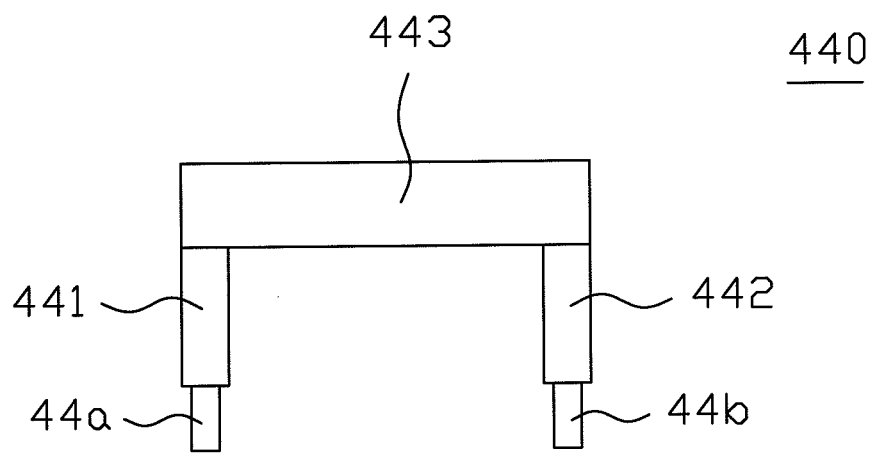
Figure 4B:
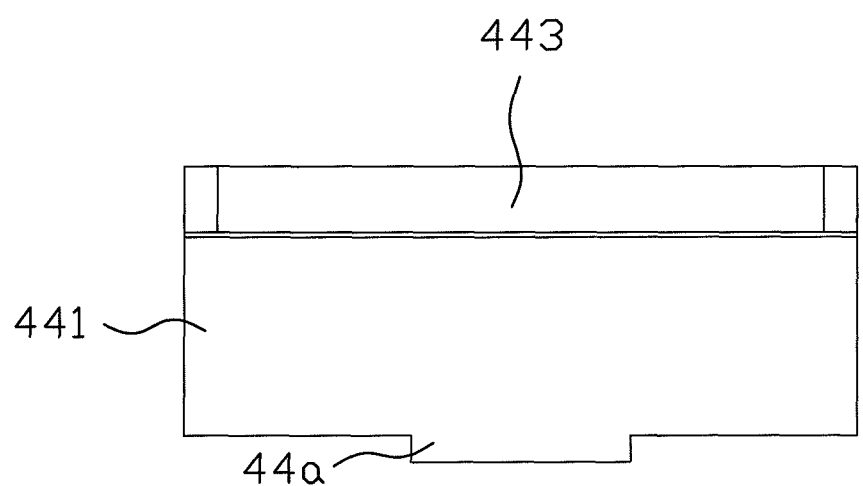
FIG. 4B shows a side-view schematic diagram illustrating the inductor module according to one embodiment of the invention.

As shown in FIG. 3C, step S26: providing an inductor module 440. In one embodiment, step S26 comprises: forming an inductor element of the inductor module 440; and forming at least one side-wing part protruding from one surface of the inductor element on at least one side of the inductor element. Specifically, the inductor module 440 may be a choke module and comprise a choke 443 as the inductor element and a first side-wing part 441 and a second side-wing part 442. The first side-wing part 441 and the second side-wing part 442 are separately provided on the two sides of the choke 443, and they also protrude from the bottom surface of the choke 443 and extend in a direction away from the bottom of the choke 443. The free ends of the first side-wing part 441 and the second side-wing part 442 form a third connection part 44a and a fourth connection part 44b, respectively. The shape of the third connection part 44a is fitted with that of the first connection part 411 and the shape of the fourth connection part 44b is fitted with that of the second connection part 412 so that the third connection part 44a has the function of assembling with the first connection part 411 and the fourth connection part 44b has the function of assembling with the second connection part 412. FIG. 4B shows a side-view schematic diagram illustrating the inductor module 440 according to one embodiment of the invention. As shown in FIG. 4B, in this embodiment, the third connection part 44a (and the fourth connection part 44b) can be a bump while in another embodiment it can be an opening or a notch. Besides, the inductor module 440 can further comprise other electronic elements to operate in coordination with the substrate 410 for having the electronic package structure 400 in operation. The choke 443 can be electrically coupled to the substrate 410 through these electronic elements to have the electronic package structure 400 in operation. The design of the inductor module 440 can be accomplished by one skilled in the art and thus the details will omitted hereafter.

Figure 3D:
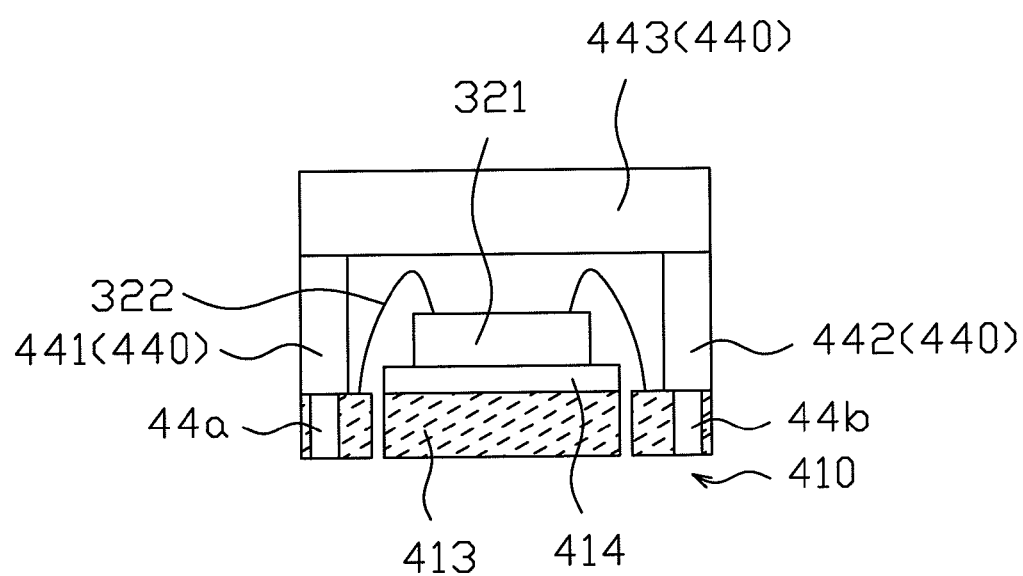

As shown in FIG. 3D, step S28: assembling the third connection part 44a and the first connection part 411 and assembling the fourth connection part 44b and the second connection part 412 so that the inductor module 440 is provide on the substrate 410 to define a space between the inductor module 440 and the substrate 410. Specifically, the choke 443, the first side-wing part 441, the second side-wing part 442 and the main body part 413 define the space (or called "mold cavity"). Furthermore, welding materials and metal welding can be used to further weld the junction of the third connection part 44a and the first connection part 411 and the junction of the fourth connection part 44b and the second connection part 412 to further reinforce the junction strength between the third connection part 44a and the first connection part 411 and between the fourth connection part 44b and the second connection part 412. Thus, the inductor module 440 can be steadily electrically coupled to the substrate 410. Auxiliary materials can be added into the welding materials and the auxiliary material can be conductive or non-conductive.

Figure 3E:
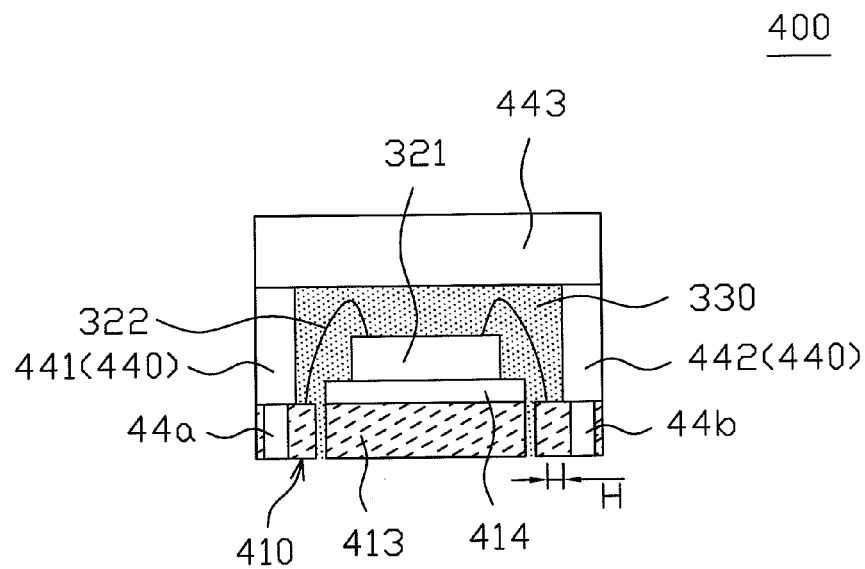
Figure 3F:
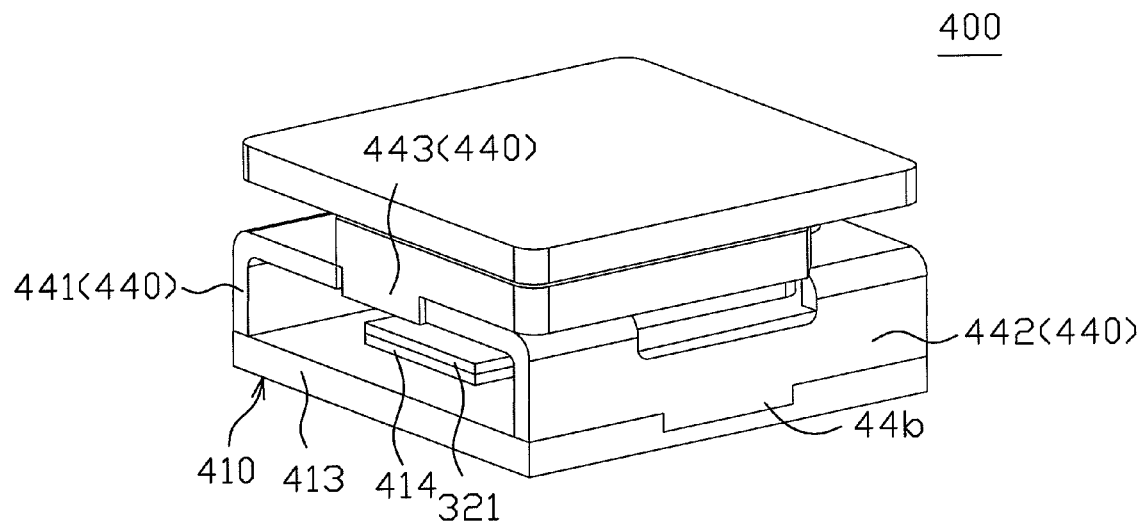
FIG. 3F shows a three-dimensional schematic diagram illustrating the electronic package structure according to one embodiment of the invention.

As shown in FIG. 3E, step S30: injecting package glue into the space defined by the inductor module 440 and the substrate 410 to form a package layer 330. In one embodiment, the thermally melt package glue is injected into the space defined by the inductor module 440 and the substrate 410 and then baked and cooled to form the package layer 330 so that the chip module 321 and the conducting wire 322 are packaged. Finally, dicing or the like is performed to form a single electronic package structure 300. In this embodiment, as shown in FIG. 3F (described later), the first side-wing part 441 and the second side-wing part 442 separately form a plane or a wall. After the inductor module 440 is positioned on the substrate 410, the choke 443 of the inductor module 440, the first side-wing part 441, the second side-wing part 442 and the substrate 440 define a space and openings are formed on the two sides of the space. A glue dispensing device can inject the package glue into the space through the opening. Since the first side-wing part 441 and the second side-wing 442 block the flow of the package glue, after the package glue is cured and the package layer 330 is formed, the width of the package layer 330 is substantially equal to the distance between the first side-wing part 441 and the second side-wing part 442.

FIG. 3F shows a three-dimensional schematic diagram illustrating the electronic package structure according to one embodiment of the invention. FIG. 3F does not show the package layer in order to clearly show the inside structure of the electronic package structure. As shown in FIGS. 3E and 3F, according to one embodiment of the invention, the electronic package structure 400 comprises a substrate 410, a chip module 321, at least one conducting wire 322, a package layer 330 and an inductor module 440. The substrate 410 comprises a main body part 413 and a first connection part 411 and a second connection part 412 provided on the two sides of the main body part 413. In this embodiment, the first connection part 411 and the second connection part 412 can be openings or notches defined by the substrate 410. The chip module 321 is provided on the main body part 413 of the substrate 410 and the conducting wires 322 are coupled between the chip module 321 and the substrate 410. The inductor module 440 can be a choke module and comprises a choke 443, a first side-wing part 441 and a second side-wing part 442. The first side-wing part 441 and the second side-wing part 442 are separately provided on the two sides of the choke 443 and protrude from the bottom surface of the choke 443 to extend toward the substrate 410. The free ends of the first side-wing part 441 and the second side-wing part 442 form a third connection part 44a and a fourth connection part 44b, respectively. The third connection part 44a is welded to the first connection part 411 and the fourth connection part 44b is welded to the second connection part 412 by metal welding so that the inductor module 440 is provided on the substrate 410 and a space is defined between the inductor module 440 and the substrate 410. The package layer 330 is provided in the space defined between the inductor module 440 and the substrate 410 and covers the chip module 321 and the conducting wires 322. The package layer 330 is formed by injecting the thermally melt package glue into the space defined by the inductor module 440 and the substrate 410 and then cooling it.

According to this embodiment, compared to the previous embodiments, this embodiment has at least one of the following merits.

1. As shown in FIG. 3E, since the first side-wing part 441 and the second side-wing part 442 extend from the choke 443 toward the main body part 413 of the substrate 410, the inductor module 440 can cover the chip module 321 to thereby inhibit electromagnetic inference (EMI).

2. In addition to being dissipated from the backside of the substrate 410, the heat generated by the chip module 321 can be transmitted from the substrate 410 through the first side-wing part 441 and the second side-wing part 442 to the choke 443 to be dissipated by the inductor module 440 so that better heat dissipation can be achieved.

3. A mold cavity is defined between the inductor module 440 and the substrate 410 and thus no additional mold is required so that the production cost can be reduced and the design change can be easily carried out.

Furthermore, in one embodiment, the electronic package structure shown in FIG. 2E and FIG. 3E can have the following merits. In one embodiment where the package layer is formed by using a mold to and then the substrate and the inductor module are assembled, due to the process limitation, the distance H between the conducting wire and the package layer should reserve a predetermined distance and a required tolerance distance in advance for placing and accurately aligning the mold. However, according to the embodiment of FIG. 2F, the shape and the size of the first side-wing part 311 are fitted with those of the first groove 351 and/or the shape and the size of the second side-wing part 312 are fitted with those of the second groove 352. According to the embodiment of FIG. 3E, since the shape of the third connection part 44*a* is fitted with that of the first connection part 411 and the shape of the fourth connection part 44*b* is fitted with that of the second connection part 412, after the third and fourth connection parts 44*a* and 44*b* are assembled to the first and second connection parts 411 and 412, respectively, the positioning function is accomplished. Thus, the accurate alignment and positioning required in the prior art using the mold is not needed for this embodiment of the invention. The distance H between the conducting wire and the package layer can be reduced to thereby further reduce the volume of the electronic package structure.

Figure 5A:
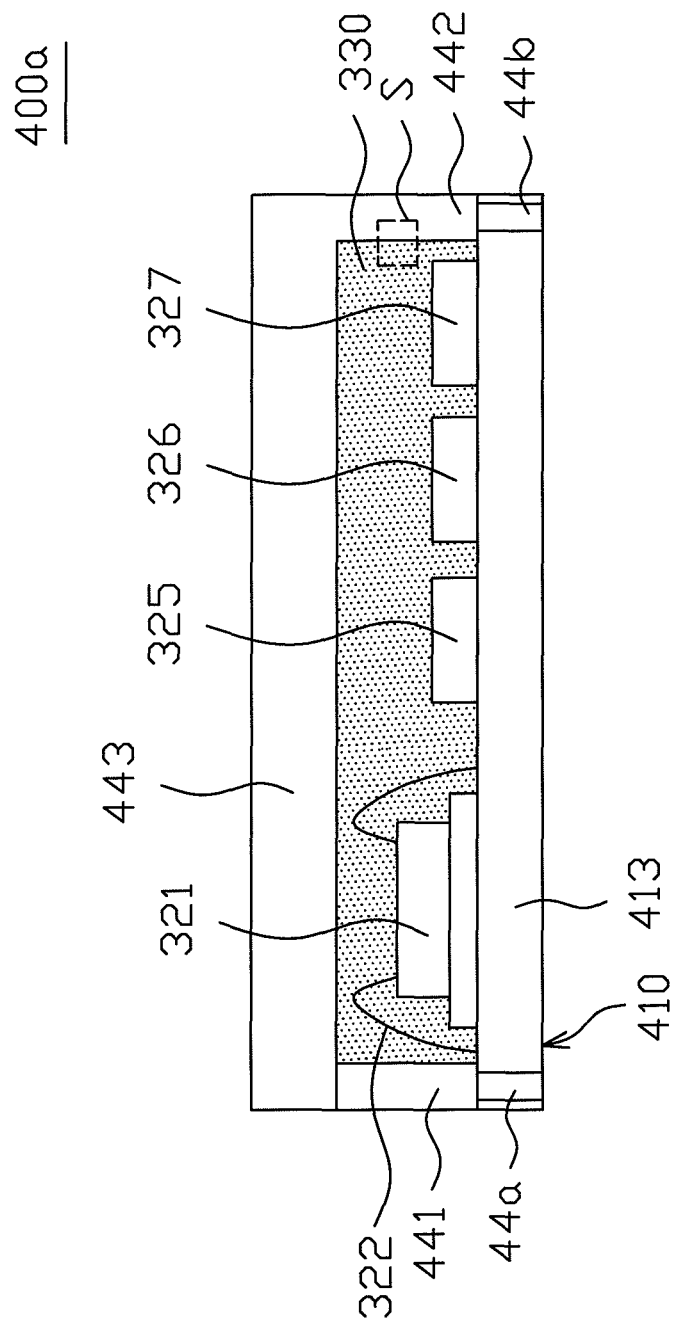
FIG. 5A shows a cross-sectional schematic diagram illustrating the electronic package structure according to one embodiment of the invention.

FIG. 5A shows a cross-sectional schematic diagram illustrating the electronic package structure according to one embodiment of the invention. The electronic package structure 400*a* of the embodiment in FIG. 5A is similar to the electronic package structure 400 of the embodiment in FIG. 3E. Thus, the same element uses the same symbol and its detailed description is omitted. In one embodiment, the main body part 413 can be provided with other electronic elements in addition to the chip module 321 in order to have the electronic package structure 400*a* possessing various different functions. As shown in FIG. 5, additionally, a resistor 325, a capacitor 326 and a MOS transistor 327 are provided on the main body part 413.

Figure 5C:
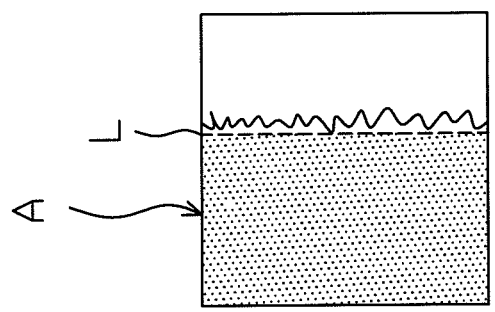
FIG. 5C shows an enlarged schematic diagram illustrating a contact area between the inductor module and the package layer in the embodiment where a mold is used to form the package layer and then the substrate and the inductor module are assembled.
Figure 5B:
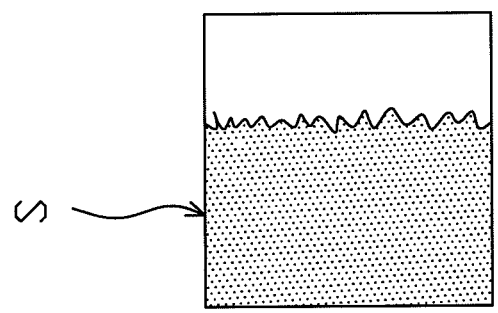
FIG. 5B shows an enlarged schematic diagram illustrating the area S of FIG. 5A.

Besides, in one embodiment, the package layer 330 is formed by injecting the thermally melt package glue into the space defined by the inductor module 440 and the substrate 410 and then cooling. The inductor module 440 and the substrate 410 are in contact with the package layer 330, separately. In the contact area of the package layer 330 with the substrate 410 and the inductor module 440, the package layer 330 is substantially filled with a rough structure located in the contact area of the substrate 410 and the inductor module 440. The area S shown in FIG. 5A is the contact area between the side-wing plate 442 of the inductor module 440 and the package layer 330. FIG. 5B shows an enlarged schematic diagram illustrating the area S of FIG. 5A. Microscopically, in the contact area S between the side-wing plate 442 of the inductor module 440 and the package layer 330, the surface of the side-wing plate 442 has a rough structure. When the package layer 330 is formed by injecting the thermally melt package glue into the space defined by the inductor module 440 and the substrate 410 and then cooling, the package layer 330 is substantially filled with the rough structure in the contact area S. FIG. 5C shows an enlarged schematic diagram illustrating a contact area between the inductor module and the package layer in the embodiment where a mold is used to form the package layer and then the substrate and the inductor module are assembled. As shown in FIG. 5C, according to the embodiment where a mold is used to form the package layer and then the substrate and the inductor module are assembled, microscopically, in the contact area A between the inductor module 440 and the package layer 330, the boundary L of the package layer 330 is only in contact with a rough structure located in the contact area A of the inductor module 440. The rough structure in the contact area A will not be filled with the thermally melt package glue.

Figure 6:
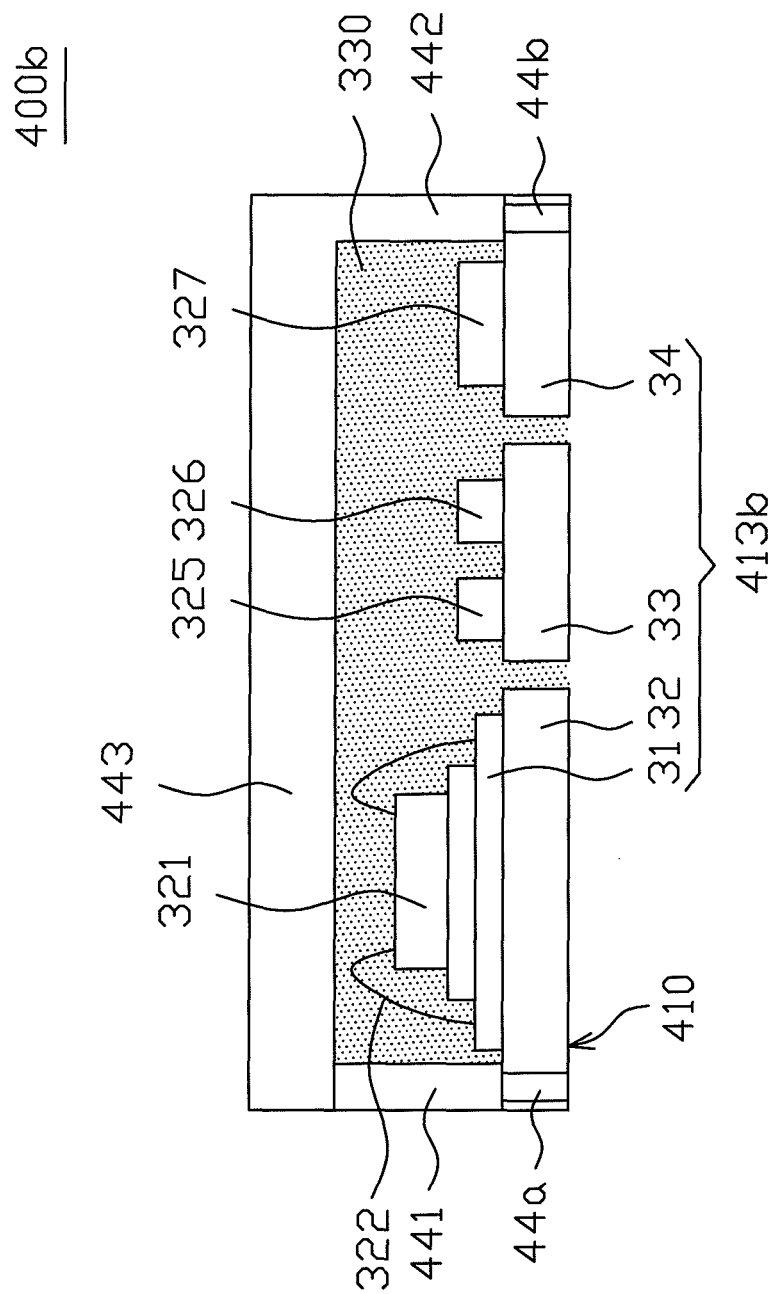
FIG. 6 shows a cross-sectional schematic diagram illustrating an electronic package structure according to one embodiment of the invention.

FIG. 6 shows a cross-sectional schematic diagram illustrating the electronic package structure according to one embodiment of the invention. The electronic package structure 400*b* of the embodiment in FIG. 6 is similar to the electronic package structure 400*a* of the embodiment in FIG. 5. Thus, the same element uses the same symbol and its detailed description is omitted. As described in the above, the invention does not limit the material of the substrate 410. The material of the substrate 410 can be a lead-frame, a printed circuit board or ceramic, etc. In this embodiment, the substrate 410 uses the composite material and the main body part 413 comprises a printed circuit board 31, a first lead-frame 32, a second lead-frame 33, a third lead-frame 34. More complicated circuits can be provided on the printed circuit board 31 and the printed circuit board 31 generates more pins to be electrically coupled with the chip module 321. Finally, the printed circuit board 31 is provided on the first lead-frame 32. The heat dissipation of the first lead-frame 32 is better than the printed circuit board 31. Therefore, according to the design of the electronic package structure 400*b*, more complicated circuits can be included and better heat dissipation can be accomplished.

Figure 7:
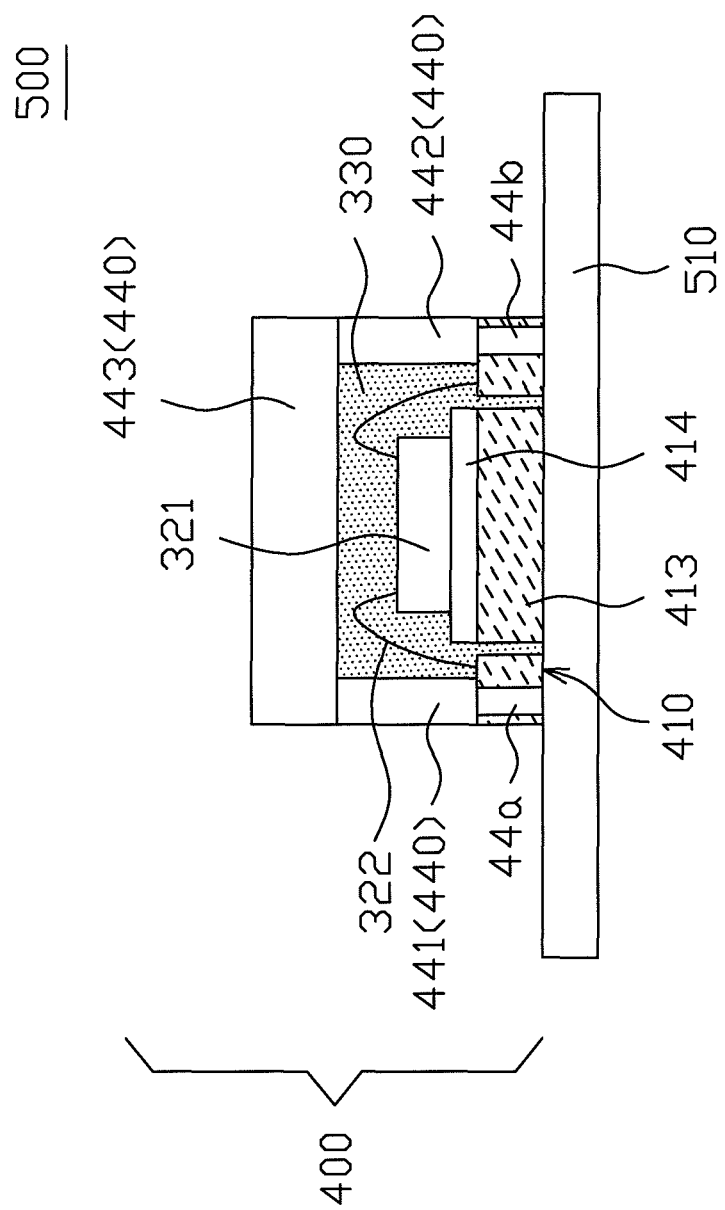
FIG. 7 shows a schematic diagram illustrating an electrical assembly.

FIG. 7 shows a schematic diagram illustrating an electrical assembly. The electrical assembly comprises the electronic package structure of one embodiment of the invention installed on a printed circuit board. As shown in FIG. 7, the electrical assembly 500 comprises a printed circuit board 510 and the electronic package structure 400 of the embodiment shown in FIG. 3E. The printed circuit board 510 comprises a circuit. The electronic package structure 400 is provided on the printed circuit board 510 to form another type of the electrical assembly. In this embodiment, the chip module 321 or the inductor module 440 is not directly electrically coupled to the substrate 410 but indirectly electrically coupled to the substrate 410 through the circuit of the printed circuit board 510.

Although the present invention has been fully described by the above embodiments, the embodiments should not constitute the limitation of the scope of the invention. Various modifications or changes can be made by those who are skilled in the art without deviating from the spirit of the invention. Any embodiment or claim of the present invention does not need to reach all the disclosed objects, advantages, and uniqueness of the invention. Besides, the abstract and the title are only used for assisting the search of the patent documentation and should not be construed as any limitation on the implementation range of the invention.

What is claimed is:

1. A method for making an electronic package structure, the method comprising:
   providing a circuit substrate;
   assembling a chip module on the circuit substrate so that the chip module is electrically coupled to a circuit of the circuit substrate;
   providing an inductor module;
   assembling the inductor module and the circuit substrate so that the inductor module, the circuit substrate and side-wing parts at two sides of one of the inductor module and the circuit substrate define a space, the space having an opening at one site of the space, the inductor module located in the space, the side-wing parts having a heat dissipation function; and
   without using any additional mold, injecting package glue from the opening into the space defined by the inductor module and the circuit substrate so as to form a package layer, wherein the package glue is coated on the chip module and is in contact with the inductor module, the circuit substrate and the side-wing parts, and wherein in the contact area of the package layer with the circuit substrate and the inductor module, the package layer is substantially filled with a rough structure located in the contact area of the circuit substrate and the inductor module.

2. The method according to claim 1, wherein the inductor module has a function for inhibiting electromagnetic inference.

3. The method according to claim 1, wherein
the step of providing a circuit substrate comprises:
forming a main body part of the circuit substrate; and
forming two first connection parts of the circuit substrate on two sides of the main body part respectively;
the step of providing an inductor module comprises:
forming an inductor element of the inductor module; and
forming the side-wing parts on two sides of the inductor element and having the side-wing parts protrude from one surface of the inductor element; and
the step of assembling the inductor module and the circuit substrate comprises:
assembling the first connection parts with the side-wing parts to dispose the inductor module on the circuit substrate so that the inductor element of the inductor module, the side-wing parts and the main body part of the circuit substrate together define the space.

4. The method according to claim 3, wherein
the step of forming the side-wing parts comprises forming two second connection parts on free ends of the side-wing parts respectively; and
the step of assembling the first connection parts with the side-wing parts comprises assembling the first connection parts with the second connection parts, so that the heat generated by the chip module can be transmitted from the circuit substrate through the side-wing parts to the inductor module to be dissipated by the inductor module.

5. The method according to claim 4, wherein the shape of the first connection part is fitted with the shape of the second connection part so as to position the inductor element on the circuit substrate.

6. The method according to claim 5, wherein the step of assembling the first connection part with the second connection part further comprises welding the second connection part with the first connection part by means of metal welding.

7. The method according to claim 1, wherein
the step of providing a circuit substrate comprises:
forming a main body part of the circuit substrate; and
forming the side-wing parts of the circuit substrate on two sides of the main body part and having the side-wing parts protrude from one surface of the main body part;
the step of providing an inductor module comprises:
forming an inductor element of the inductor module; and
forming two first connection parts on two sides of the inductor element; and
the step of assembling the inductor module and the circuit substrate comprises:
assembling the first connection parts with the side-wing parts to provide the inductor module on the circuit substrate so that the inductor element of the inductor module, the main body part of the circuit substrate and the side-wing parts together define the space.

8. The method according to claim 7, wherein
the step of forming the side-wing parts comprises forming two second connection parts on free ends of the side-wing parts respectively; and
the step of assembling the first connection parts with the side-wing parts comprises assembling the first connection parts with the second connection parts, so that the heat generated by the chip module can be transmitted from the circuit substrate through the side-wing parts to the inductor module to be dissipated by the inductor module.

9. The method according to claim 8, wherein the inductor module is a choke module and the inductor element is a choke.

10. An electronic package structure, comprising:
a circuit substrate comprising a circuit for having the electronic package structure in operation;
a chip module disposed on the circuit substrate wherein the chip module is electrically coupled to a circuit of the circuit substrate;
an inductor module, operating in coordination with the circuit substrate so as to have the electronic package structure in operation and defining a space together with the circuit substrate and side-wing parts at two sides of one of the inductor module and the circuit substrate, wherein the space has an opening at one site of the space, the inductor module is located in the space, the side-wing parts has a heat dissipation function; and
a package layer, being in the space and coated on the chip module;
wherein the package layer is formed, without using any additional mold, by injecting package glue from the opening into the space defined by the inductor module and the circuit substrate, wherein the package glue is coated on the chip module and is in contact with the inductor module, the circuit substrate and the side-wing parts, and wherein in the contact area of the package layer with the circuit substrate and the inductor module, the package layer is substantially filled with a rough structure located in the contact area of the circuit substrate and the inductor module.

11. The structure according to claim 10, wherein the inductor module has a function for inhibiting electromagnetic inference.

12. The structure according to claim 11, wherein:
the circuit substrate comprises:
a main body part wherein the chip module is provided on the main body part; and
two first connection parts, respectively provided on two sides of the main body part;
the inductor module comprises:
an inductor element; and
the side-wing parts, respectively provided on two sides of the inductor element and protruding from one surface of the inductor element;
wherein the side-wing parts extends from the inductor element toward the circuit substrate so that the side-wing parts are assembled with the first connection parts respectively.

13. The structure according to claim 12, wherein two free ends of the side-wing parts form two second connection parts and the second connection parts are assembled with the first connection parts respectively.

14. The structure according to claim 13, wherein
the second connection parts are electrically conductive;
the first connection parts are electrically coupled to the circuit of the circuit substrate respectively; and
the second connection parts and the first connection parts are assembled by means of metal welding so that the inductor module is electrically coupled to the circuit substrate.

15. The structure according to claim 13, wherein the shape of the first connection parts are fitted with the shape of the second connection parts so as to position the inductor element on the circuit substrate.

16. The structure according to claim 15, wherein the first connection parts are an opening or a notch defined by the circuit substrate and the second connection parts are a bump.

17. The structure according to claim 16, wherein the second connection parts and the first connection parts are assembled by means of metal welding.

18. The structure according to claim 10, wherein the back side of the circuit substrate has a heat dissipation function.

19. The structure according to claim 10, wherein the circuit substrate is a lead-frame, a printed circuit board, or a ceramic or the combination of any two of the following: the lead-frame, the printed circuit board, and the ceramic.

20. The structure according to claim 10, wherein the inductor module is a choke module.

21. The structure according to claim 10, further comprising:
at least one electronic element provided on the circuit substrate.

22. The structure according to claim 10, wherein
the circuit substrate comprises:
a main body part wherein the chip module is provided on the main body part; and
the side-wing parts, provided on two sides of the main body part and protruding from one surface of the inductor element; and
the inductor module comprises:
an inductor element; and
two first connection parts, respectively provided on two sides of the inductor element;
wherein the side-wing parts extend from the main body part toward the inductor module so that the side-wing parts are assembled with the first connection parts respectively.

23. The structure according to claim 22, wherein the electronic package structure is adapt to be provided on a circuit board and the chip module or the inductor module is electrically coupled to the circuit substrate through the circuit board.

24. An electronic package structure, comprising:
a circuit substrate comprising a circuit for having the electronic package structure in operation;
a chip module on the circuit substrate so that the chip module is electrically coupled to a circuit of the circuit substrate;
an inductor module operating in coordination with the circuit substrate so as to have the electronic package structure in operation and comprising:
an inductor element;
a first side-wing part, provided on one side of the inductor element and protruding from one surface of the inductor element; and
a second side-wing part, provided on the other side of the inductor element and protruding from the surface of the inductor element so that the surface, the circuit substrate, the first side-wing part and the second side-wing part define a space, wherein the inductor module is located in the space and the space has an opening at one site of the space; and
a package layer, provided in the space and coated on the chip module;
wherein the width of the package layer is equal to or substantially equal to the distance between the first side-wing part and the second side-wing part.

25. The structure according to claim 24, further comprising:
the circuit substrate is a lead-frame, a printed circuit board, or a ceramic or the combination of any two of the following: the lead-frame, the printed circuit board, and the ceramic; and
the inductor module is a choke module and the inductor element is a choke.

26. The structure according to claim 25, wherein the inductor module has a function for inhibiting electromagnetic inference.

* * * * *